United States Patent
Leipold et al.

(10) Patent No.: US 6,658,748 B1
(45) Date of Patent: Dec. 9, 2003

(54) DIGITALLY-CONTROLLED L-C OSCILLATOR

(75) Inventors: Dirk Leipold, Plano, TX (US); Robert B. Staszewski, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/679,793

(22) Filed: Oct. 5, 2000

Related U.S. Application Data

(60) Provisional application No. 60/186,452, filed on Mar. 2, 2000.

(51) Int. Cl.$^7$ ................................................ H03B 1/00
(52) U.S. Cl. .................... 33/179; 331/177 V; 331/36 C; 331/167; 331/117 R; 327/156; 327/159
(58) Field of Search ................ 331/177 V, 36 C, 331/108 C, 179, 1 A, 167, 117 R; 327/156, 159

(56) References Cited

U.S. PATENT DOCUMENTS

| | | | | |
|---|---|---|---|---|
| 5,053,723 A | * | 10/1991 | Schemmel | 331/14 |
| 6,028,488 A | | 2/2000 | Landman et al. | 331/1 A |
| 6,268,778 B1 | * | 7/2001 | Mucke et al. | 331/117 R |

* cited by examiner

*Primary Examiner*—Arnold Kinkead
(74) *Attorney, Agent, or Firm*—Ronald O. Neerings; Wade James Brady, III; Frederick J. Telecky, Jr.

(57) ABSTRACT

A fully digitally-controlled LC tank oscillator (DCO) uses a bank of more significant binary-weighted and/or less significant equally-weighted capacitors that are switched between only two voltage potentials. The time-averaged value of capacitance of predetermined less significant capacitors is determined by dithering between the two states to achieve a further refinement in the resolution of the resonating frequency.

27 Claims, 14 Drawing Sheets

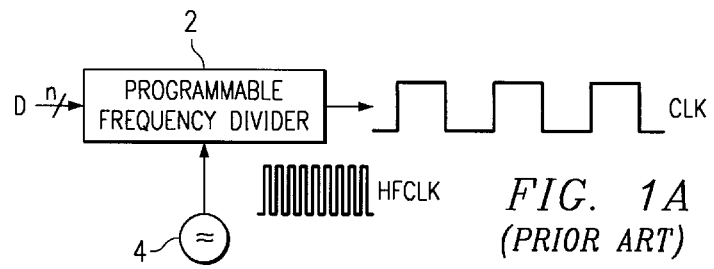
*FIG. 1A*
*(PRIOR ART)*
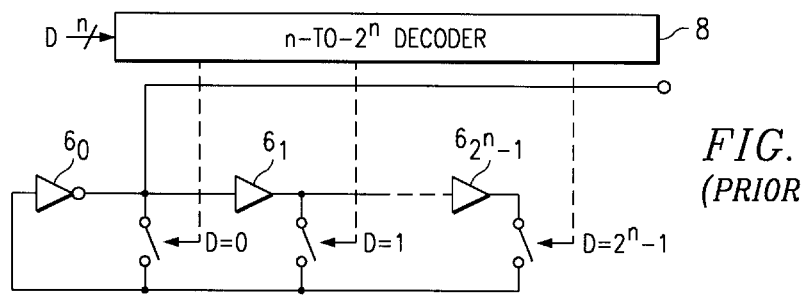
*FIG. 1B*
*(PRIOR ART)*
*FIG. 1C*
*(PRIOR ART)*
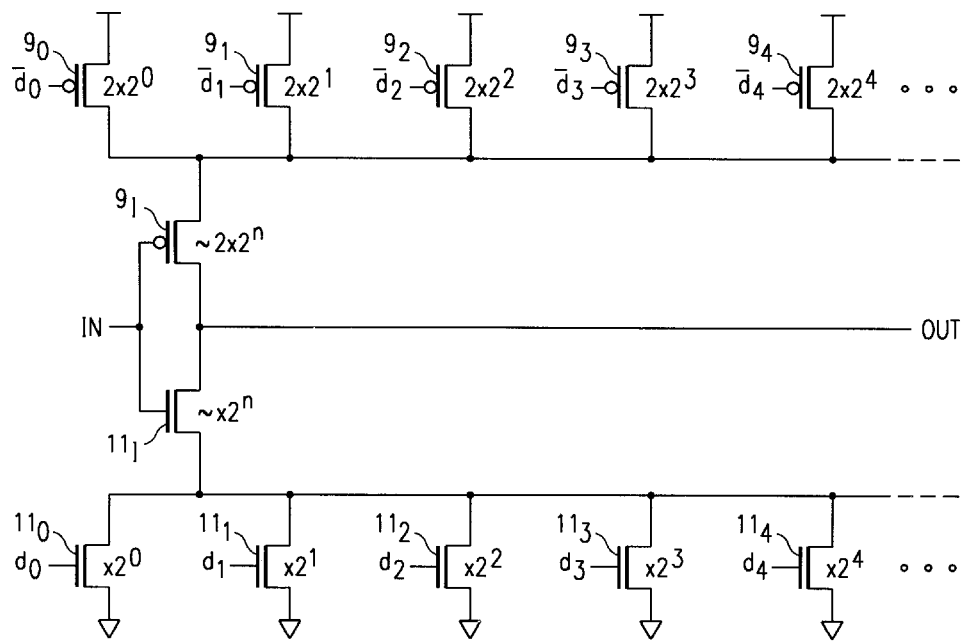

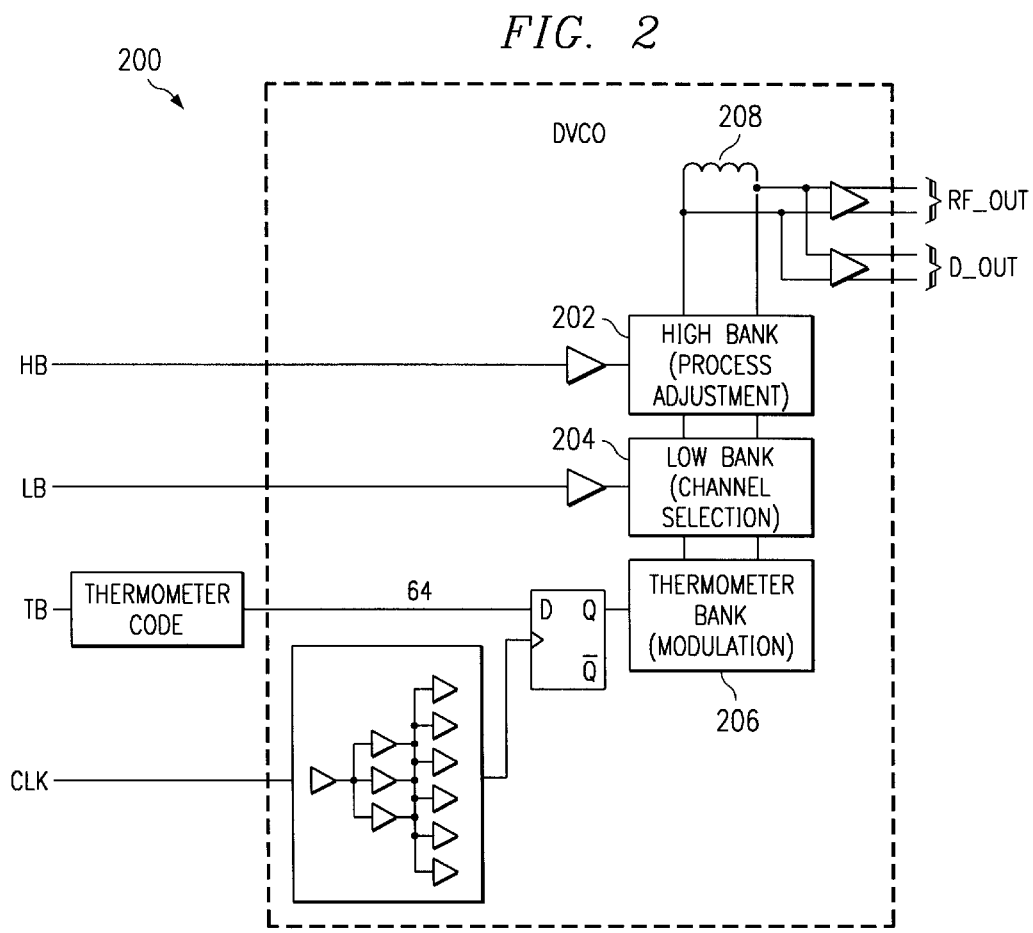
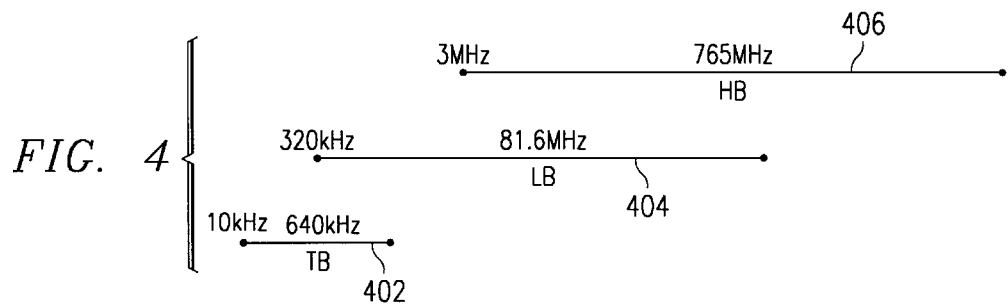

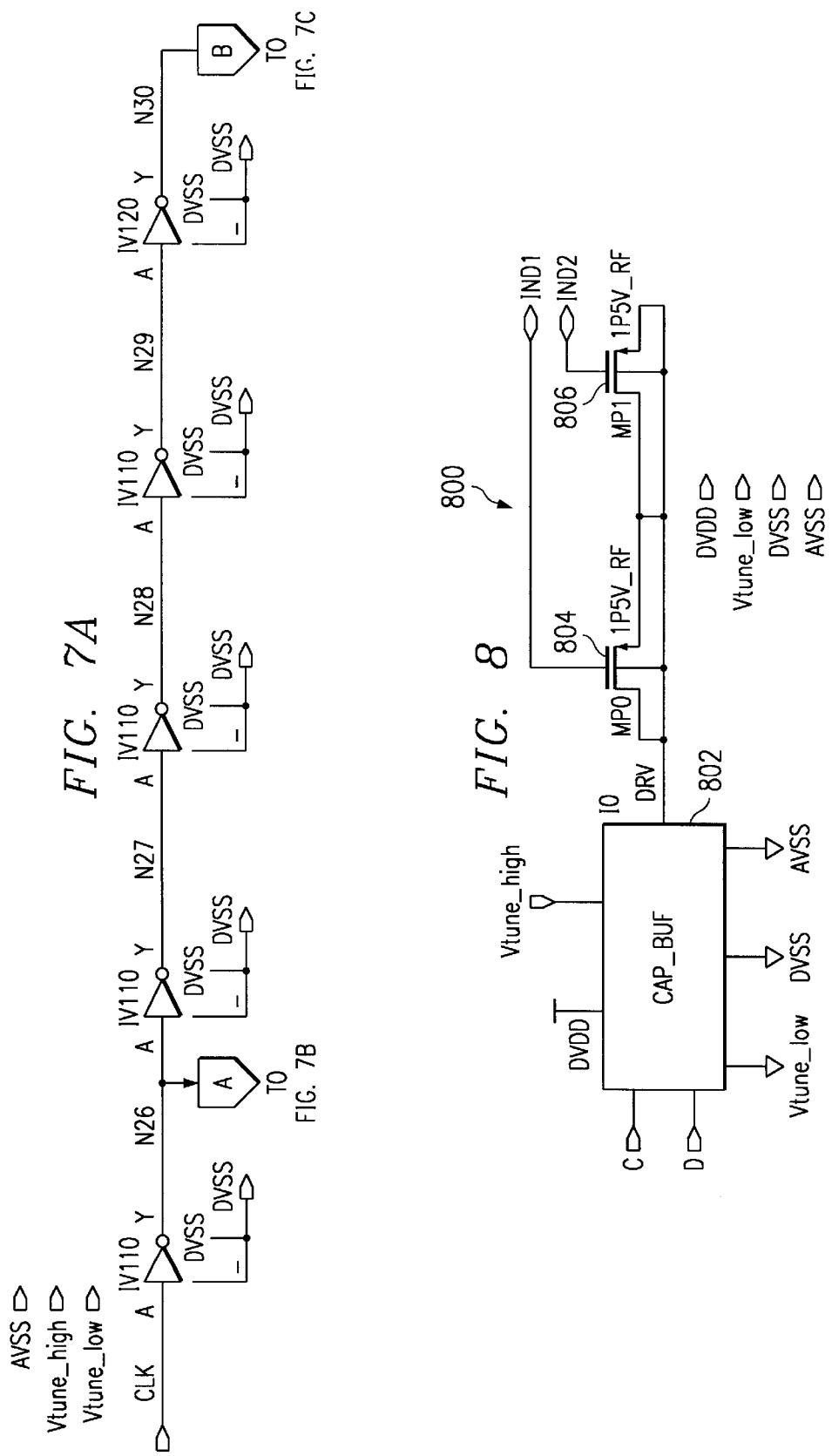

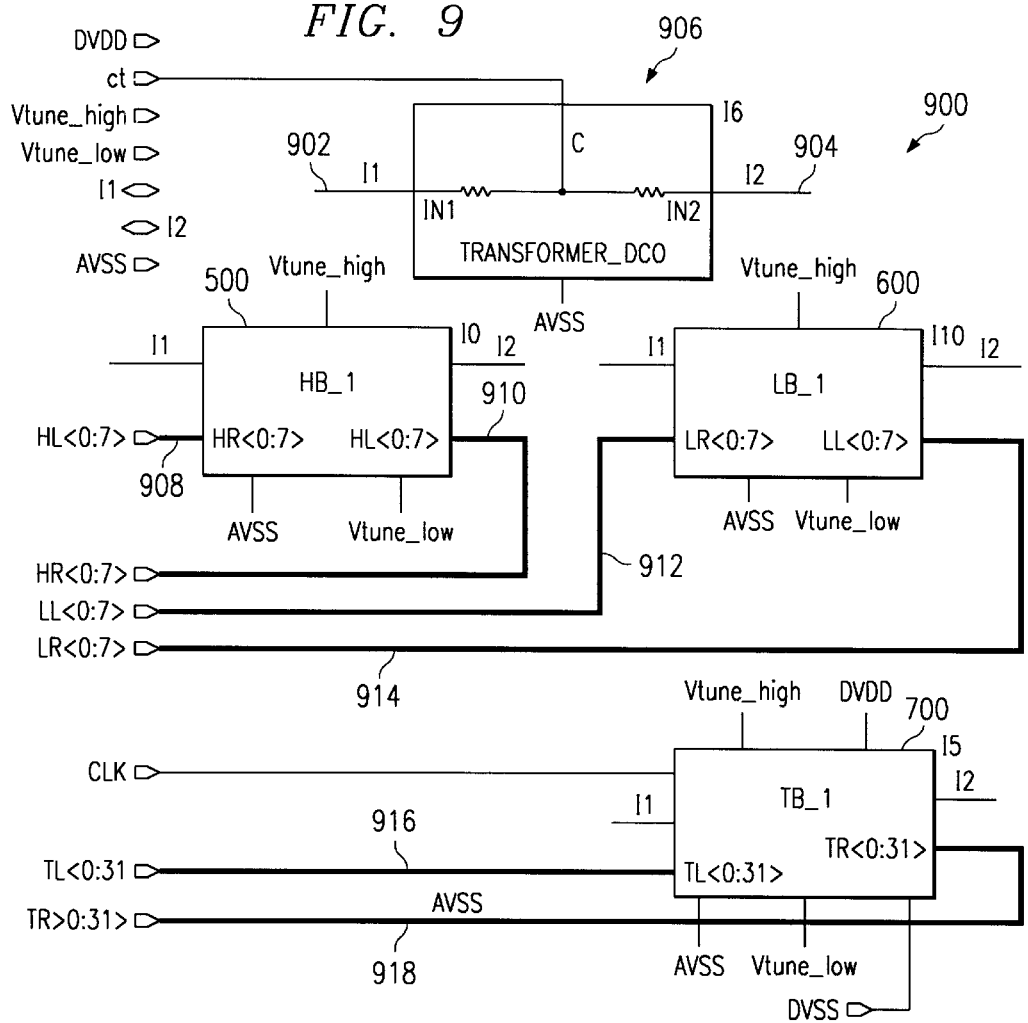

DIGITALLY-CONTROLLED L-C OSCILLATOR

RELATED PATENT APPLICATIONS

This application claims the benefit, under 35 U.S.C. §119(e)(1), of U.S. Provisional Application No. 60/186,452, entitled DIGITALLY-CONTROLLED VCO, filed Mar. 2, 2000 by Dirk Leipold and Robert Staszewski.

BACKGROUND OF THE INVENTION

1. Field of the Invention

This invention relates generally to voltage controlled oscillators, and more particularly to a fully digitally-controlled LC tank oscillator (DCO) that employs one or more banks of more significant binary-weighted and/or less significant equally-weighted capacitors in which certain less significant capacitors are dithered between only two voltage potentials to increase the resolution of desired less significant capacitors.

2. Description of the Prior Art

Operating clock rates of modern VLSI circuits, such as microprocessors and digital signal processors (DSPs), have increased greatly over recent years. These clock rates, now up to on the order of GHz, and the corresponding increase in the number of operations that can be performed over time by the VLSI circuits, have provided dramatic increases in the functionality of electronic computing systems, including mobile, battery-powered, systems such as notebook computers, wireless telephones, and the like. In order to provide such high speed functionality, functions such as on-chip clock generation and clock recovery (i.e., generation of timing information from serial bitstreams) must of course operate at these high frequencies.

As related to clock generation, the increase in clock frequencies has in turn made the timing constraints for communication among the various integrated circuits more stringent. Particularly in systems that utilize synchronous operation and data communication among multiple integrated circuits, the timing skew between external system clocks and the internal clocks that control the operation of the integrated must be reduced to very small margins.

Conventional systems generally utilize analog PLLs for on-chip generation and synchronization of internal clock signals from system reference clocks. Typical analog PLLs include a phase detector that compares the phase relationship of the reference clock to an internal clock, a charge pump and loop filter for setting an analog voltage corresponding to this phase relationship, and a voltage-controlled oscillator (VCO) for generating an output clock signal in response to the analog voltage from the charge pump and loop filter. In recent years, digital phase detectors have been used in on-chip PLLs in combination with the analog charge pump and filter, and the analog VCO; such PLLs have been referred to as "digital", but of course in reality these PLLs are hybrid digital and analog circuits.

Recently, efforts have been made toward the development of fully digital PLLs. In combination with a digital phase detector, fully digital PLLs include a digital loop filter instead of the traditional analog filter, and include a digitally-controlled oscillator instead of the voltage controlled oscillator. In theory, these fully digital PLLs have several advantages over their analog counterparts. First, digital logic exhibits much better noise immunity than analog circuitry. Second, analog components are vulnerable to DC offset and drift phenomena that are not present in equivalent digital implementations. Further, the loop dynamics of analog PLLs are quite sensitive to process technology scaling; whereas the behavior of digital logic remains unchanged with scaling. This requires much more significant redesign effort to migrate analog PLLs to a new technology node than is required for digital PLLs.

Moreover, power dissipation is of extreme concern for portable, battery-powered, computing systems, as power dissipation relates directly to battery life. As a result, many manufacturers are reducing the power supply voltage requirements of the integrated circuits, particularly those that are specially adapted for portable computing systems, to reduce the power consumed by these devices. It has been observed however, that a reduction in the power supply voltage applied to analog circuitry, such as analog or hybrid PLLs, does not necessarily reduce the power dissipated by these circuits; in some cases, aggressive voltage scaling has been observed to increase the power dissipated by analog circuits. Additionally, reduction in the power supply voltage to analog circuits renders the design of robust circuits much more difficult, given the reduced available "headroom" for the circuits.

In view of the foregoing, PLLs in which digital techniques are used in not only the phase detector, but also in the loop filter and the controllable oscillator, are very attractive to designers. In particular, and as noted above, the implementation of fully digital PLLs to include a digitally-controlled oscillator (DCO), which is an oscillator that operates at a frequency controlled by the value of a digital control word applied thereto, has become especially attractive.

As is known in the art, high frequency circuits other than clock generation circuits also may benefit from the implementation of an all-digital PLL. For example, as noted above, the function of clock recovery (i.e., the extraction of timing information and synchronization from a serial bitstream) is common in effecting high-frequency data communication among integrated circuits and systems. It is, of course, desirable to communicate data at as high a frequency as possible, and as such the frequencies at which clock recovery circuitry are to operate are ever-increasing. Further, considering that communication is a primary function in many battery-powered systems, such as wireless telephones, wireless modems in portable computers, and the like, it is desirable to reduce power dissipation and, consequently, the supply voltage required to implement clock recovery circuits, along with increasing the frequency of operation thereof. As such, many of the advantages provided by fully digital PLLs and the DCOs associated therewith are also beneficial to clock recovery circuits, as well as other applications in modern integrated circuits. The utility of the DCO however, is not limited to PLL applications. In fact, it is contemplated that any application requiring a frequency-programmable oscillator has the potential to benefit from an efficient implementation of a DCO.

The fundamental function of a DCO is to provide an output waveform that has a frequency of oscillation $f_{DCO}$ that is a function of a digital input word D, as follows:

$$f_{DCO} = f(D) = f(d_{n-1} \cdot 2^{n-1} + d_{n-2} \cdot 2^{n-2} + \ldots + d_1 \cdot 2^1 + d_0 \cdot 2^0)$$

Typically, the DCO transfer function $f(\ldots)$ is defined so that either the frequency $f_{DCO}$ or the period of oscillation $T_{DCO}$ is linear with D, generally with an offset. A DCO transfer function, for example, that is linear in frequency is typically expressed as:

$$f(D) = f_{offset} + D \cdot f_{step}$$

where $f_{offset}$ is a constant offset frequency and $f_{step}$ is the frequency quantization step. Similarly, a DCO transfer function that is linear in period is typically expressed as $$T(D)=1/f(D)\approx T_{offset}-D\cdot T_{step}$$

where $T_{offset}$ is a constant offset period and $T_{step}$ is the period quantization step. It is of course evident that, since the DCO period T(D) is a function of a quantized digital input D, the DCO cannot generate a continuous range of frequencies, but rather produces a finite number of discrete frequencies.

One common type of conventional DCO includes a high-frequency oscillator in combination with a dynamically programmable frequency divider. An example of this type of DCO is illustrated in FIG. 1a. In this example, programmable frequency divider 2 receives an n-bit digital word D which indicates the divisor value at which the frequency of the output signal HFCLK of high-frequency oscillator 4 is to be divided in generating the DCO output signal CLK. In this conventional arrangement, the period quantization step $T_{step}$, and thus the lower bound of the timing jitter, is limited to the period of high-frequency oscillator 4. Low jitter operation thus requires oscillator 4 to operate at an extremely high frequency; for example, a 0.2 nsec step between periods requires high frequency oscillator 4 and programmable counter 2 to operate at 5 GHz.

Because of this limitation, other conventional DCO approaches directly synthesize a signal, rather than dividing down from a high frequency source. One example of a conventional direct-synthesis DCO is illustrated in FIG. 1b, which is arranged as a variable length ring oscillator. In this example, $2^n$ delay stages 6 are connected in series, with lowest order stage $6_0$ being an inverting stage and driving the output signal on line CLK. Decoder 8 decodes n-bit digital control word D in $2^n$ control lines, each of which are operable to short out a corresponding stage 6, and one of which is asserted in response to the value of the digital control word D. The period of oscillation T is thus twice the sum of the delays of those delay stages 6 within the ring. For example, if the delay through each stage 6 is $T_6$, in the case where D=0 such that only stage $6_0$ is in the ring, the period of oscillation T will equal $2T_6$; in the case where $D=2^{n-1}$ (D is at its maximum), the period of oscillation T will equal $2(2^n) T_6$, as all $2^n$ stages 6 will be connected in the ring. In this conventional approach, the period quantization step (which sets a lower bound on the jitter) is thus $2T_6$ or twice the propagation delay of stage 6, which is typically an improvement over that of the conventional DCO of FIG. 1a, but which still may be too course for many applications. However, the integrated circuit chip area required for realization of the variable delay ring oscillator of FIG. 1b is substantial, considering that the number of stages 6 is exponential with the number of bits in the control word D and that typical delay stages can be quite complex, with some reported implementations requiring more than twenty transistors per stage. Further, the complexity of decoder 8 is also exponential with n, itself requiring on the order of $(n+6)2^n$ unit-size transistors. The total complexity of the circuit is therefore relatively large, resulting in a chip area that varies with n by on the order of $(n+30)2^n$. Accordingly, a high resolution DCO constructed in this fashion can occupy a tremendous amount of chip area.

Another known approach to implementation of a digital PLL is described in J. Dunning et al., "An All-Digital Phase-Locked Loop with 50-Cycle Lock Time Suitable for High-Performance Microprocessors", J. Solid State Circ. (IEEE, Apr. 1995), pp. 412–422. According to this conventional approach, the desired output frequency is directly synthesized through the operation of an eight-stage current-starved ring oscillator, one such stage illustrated in FIG. 1c, where each inverting delay stage includes a pull-up leg of parallel binary-weighted transistors 9, and a pull-down leg of parallel binary-weighted transistors 11. Each transistor $9_I$, $11_I$ is turned on by a corresponding bit $d_I$ (or its complement) of the control word d; switching transistors $9_I$, $11_I$ are controlled by the state of line IN, and drive line OUT at their common drain node. While acceptable frequency resolution is provided according to this approach, the amount of integrated circuit chip area required for implementation of this PLL is extremely large. Since NMOS transistor $11_I$ weighted by a factor of $2^i$ is generally realized as $2^i$ minimum-size transistors $11_0$ in parallel, the number of unit-size NMOS transistors 110 in a delay stage such as shown in FIG. 1c is $2(2^n)-1$. Assuming a PMOS transistor 9 to be twice the size of its corresponding NMOS transistors 11, the total number of unit-size transistors required to realize the delay stage of FIG. 1c may be considered as:

$$2(2^n)-1+2[2(2^n)-1]=6(2^n)-3$$

For a DCO of this construction having eight delay stages, the area required for implementation will therefore vary with n by on the order of $48(2^n)$.

By way of further background, another example of a conventional digitally-controlled oscillator is described in F. Lu, H. Samueli, J. Yuan, and C. Svensson, "A 700-MHz 24-b Pipelined Accumulator in 1.2-$\mu$m CMOS for Applications as a Numerically Controlled Oscillator", IEEE Journal of Solid-State Circuits, Vol. 28, No. 8 (IEEE, August 1993), pp. 878–886.

One DCO implemented to overcome the disadvantages described above in association with conventional digitally-controlled oscillators known in the art is disclosed in U.S. Pat. No. 6,028,488, entitled Digitally-controlled oscillator with switched-capacitor frequency selection, issued Feb. 22, 2000 to Landman, et al. The DCO disclosed in the '488 patent is realized by way of a switched-capacitor array that loads a driver within the oscillator. The switched-capacitor array includes a binary-weighted set of capacitors, each of which has its capacitance controlled by one bit of a digital control word from a digital loop filter. The step size between adjacent oscillation periods, and thus the jitter, is defined by the capacitance of the least significant capacitor (corresponding to the LSB of the control word) in combination with the strength of the driver.

SUMMARY OF THE INVENTION

In view of the foregoing, it is desirable and necessary to provide a digitally-controlled oscillator (DCO) having a significantly higher resolution than that achievable using a switched-capacitor bank in which the capacitance of the least significant capacitor (corresponding to the LSB of the control word) is fundamentally relied upon to establish the resolution of the DCO.

In one aspect of the invention, a DCO is provided that can operate at low power supply voltages.

In still another aspect of the invention, a DCO is provided that operates with extremely low levels of jitter.

In yet another aspect of the invention, a DCO is provided that requires a relatively modest amount of chip area relative to conventional DCO circuits.

In yet another aspect of the invention, a DCO is provided that can function in association with a digital phase-locked loop (PLL).

In yet another aspect of the invention, a DCO is provided that has significantly smaller oscillator phase noise than that generated by known DCOs that employ a delayed feedback using a variable load.

In still another aspect of the invention, a DCO is provided that operates with substantially any negative resistance feedback source (Colpitts oscillator, gun diode, and the like) to achieve stable oscillation.

In still another aspect of the invention, a DCO is provided that accommodates the modulation and channel selection requirements associated with the "BLUETOOTH" standard.

A digitally-controlled oscillator according to one embodiment of the present invention is constructed as an LC tank oscillator (i.e., digitally-tunable tank circuit), where the resonant frequency inside the oscillator is changed. The LC tank oscillator is a resonator that is formulated from virtually any negative resistance source (e.g., Colpitts oscillator, gun diode, and the like) to bring the resonator to a stable oscillation. A binary-weighted capacitor bank is employed in association with a small bank of unity minimum size capacitors that are switched fast between two states to dither or modulate (similar to dithering as used in conventional D/A converters, except the present dithering is digital-to-frequency conversion rather than digital-to-analog conversion) the LSB(s) and use the Q of the digitally-tunable tank circuit as a low pass function. A DCO that uses such a tank circuit has significantly reduced phase noise when compared with conventional DCOs in which the feedback is delayed using a variable load, since the tank circuit of the present invention can be designed with a high Q. The DCO is therefore realized using an LC tank circuit in which the frequency resolution can be adjusted in such a way as to accommodate both modulation and channel selection requirements necessary to achieve "BLUETOOTH" RF communication otherwise not achievable using other known DCO architectures. As used herein, RF means any frequency that can be communicated over the communications medium that is being utilized.

The present DCO can receive a digital input word from a digital PLL such as disclosed in U.S. patent application Ser. No. 09/603,023, entitled Digital Phase-Domain PLL Frequency Synthesizer, by Robert B. Staszewski and Dirk Leipold, filed Jun. 26, 2000, and that is incorporated by reference herein in its entirety.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein:

FIGS. 1a through 1c are electrical diagrams, in block form, of conventional digitally-controlled oscillators;

FIG. 2 is a high-level block diagram illustrating a digitally-controlled VCO (DVCO/DCO) according to the most preferred embodiment of the present invention;

FIG. 4 is a diagram illustrating high bank, low bank and thermometer bank control ranges and granularities associated with the DCO high, low and thermometer capacitor banks depicted in FIG. 2 and suitable to accommodate the Gaussian frequency shift keying (GFSK) modulation scheme of "BLUETOOTH" or GSM;

FIG. 8 is a schematic diagram illustrating a more detailed view of a two capacitor cell for the thermometer capacitor bank shown in FIG. 7;

FIG. 9 is a schematic diagram illustrating a tunable LC tank circuit incorporating the high capacitor bank, low capacitor bank and thermometer capacitor bank circuits shown in FIGS. 5–7 respectively;

Figure 3:
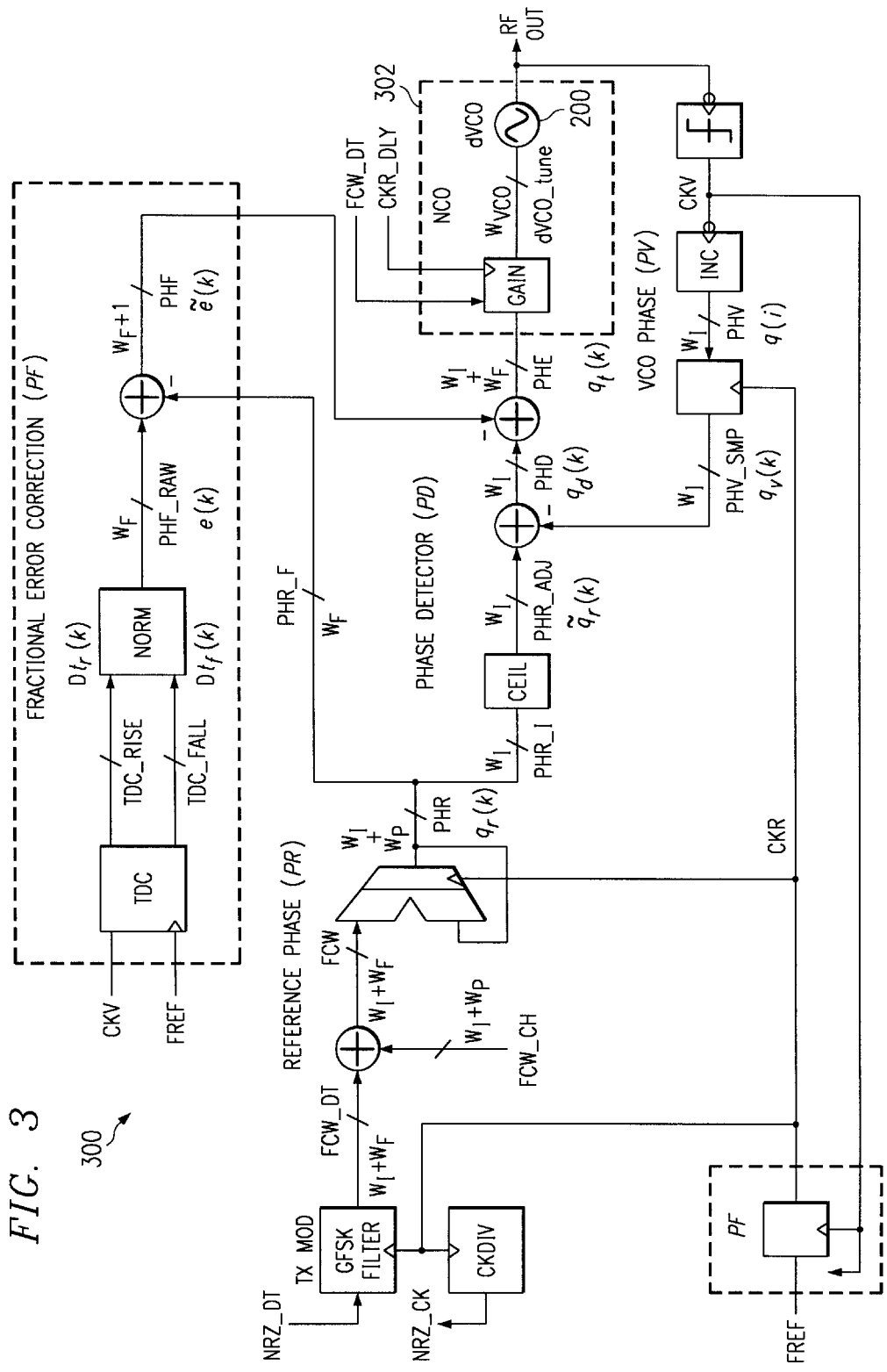
FIG. 3 is a diagram illustrating a digital phase-domain PLL frequency synthesizer suitable for incorporating the DCO depicted in FIG. 2.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

The construction and operation of a digitally-controlled oscillator (DCO) according to the preferred embodiments of the present invention will now be set forth in detail. As will become apparent from the following description, many integrated circuit applications may benefit from the present invention, in that the present DCO may be efficiently realized in a modest amount of chip area for a given frequency resolution. Integrated radio frequency (RF) circuits which are to operate at high frequencies while still concerned with power dissipation (and thus operating at low power supply voltages, e.g. CMOS), may also particularly benefit from the present invention. According to one embodiment as seen in FIG. 2, DVCO (DCO) 200 synthesizes a periodic signal at a frequency that is determined by the value of a digital control word in a beneficial manner, as will now be described in detail with reference to FIGS. 2–10.

FIG. 2 is a high-level block diagram of a DCO 200 including a pair of binary-weighted switched capacitor banks (high bank (HB) 202 and low bank (LB) 204) in combination with a bank of equally weighted switched capacitors (thermometer bank (TB)/LSB dithering system) 206 and that is integrated with an inductor 208 to implement a digitally tunable VCO system according to the preferred embodiment of the present invention. It can be appreciated that DCO 200 may be integrated with many different types of digital PLLs suitable for use in an integrated circuit, such as a digital signal processor or such as the digital phase-domain PLL frequency synthesizer 300 depicted in FIG. 3. A detailed discussion of the synthesizer 300 is presented in the '023 patent application referenced herein before and is presented herein only to demonstrate one such use of the DCO 200. With continued reference now to FIG. 2, the HB 202 bits, LB 204 bits and TB 206 bits could ultimately come, for example, from the NCO 302 multiplier output (PHE times gain) depicted in FIG. 3 to generate a DCO tuning control word. The gain element, described more fully in the '023 patent, is necessary in order to have a controlled frequency response of the DCO 200 and the PLL loop behavior. The HB 202 bits, LB 204 bits and TB 206 bits can be formulated of any convenient or desired number of bits, limited by only the technology and architecture employed. The control word can be generated therefore, using the process described in the '023 application, incorporated by reference herein. The present inventors found that a workable DCO can be implemented by keeping the HB 202 bits programmable, so that a user or ARM controller, for example, can set them appropriately in the center of the desired operational band. The TB 206 bits are the thermometer-encoded bits that come from the lower order part of the same control word that contains the LB 204 bits. One or more of the TB 206 bits are then dithered or delta-sigma modulated to generate a small frequency modulation having a very small modulation index in combination with a very high modulation speed such that the sidebands generated are very small. In this way, a much higher resolution can be achieved as contrasted with a DCO architecture that simply uses a switched capacitor bank, since the resolution obtainable using the switched capacitor bank is fundamentally limited to the capacitance of the least significant capacitor (corresponding to the LSB of the control word), as stated herein before. According to one embodiment, the present dithering process most preferably then further increases the resolution of the controllable LSB(s) such that at least 22-bits of resolution can be obtained using a 1.2 volt supply in order to accommodate "BLUETOOTH" modulation and channel selection requirements. The DCO 200 includes a tunable LC tank circuit that may have a center-tapped transformer-like inductor 208 and in which the capacitance is determined via a plurality of varactor banks comprising the high bank (HB) 202, low bank (LB) 204 and the thermometer bank (TB) 206. The present invention is not so limited however, and it shall be understood that many other LC tank circuit architectures can be employed to practice the present invention. The varactor banks 202, 204, 206 can be implemented such as the binary-weighted array of controllable capacitors described in association with the DCO disclosed in the '488 patent referenced herein above, but modified as discussed herein to implement dithering of one or more LSB capacitors as illustrated for the embodiment depicted in FIG. 2. The LC tank circuit has a resonant frequency that can then be modified or changed by the foregoing discussed dithering process since the one or more LSB capacitors in the TB varactor bank 206 can be selectively dithered. It can be appreciated that the Q of the LC tank circuit performs a time-averaging operation. In this way, a low-pass filtering function equivalent necessary to realize very fast sigma-delta modulated digital-to-frequency conversion (i.e. for noise shaping) is implemented such that spurious radiation can be generated only outside the frequency band of interest, and that can be easily suppressed via an antenna filter.

Most preferably, digital-to-frequency conversion is updated, for example, at a much higher frequency ($>>f_{ref}$) than that generally used by conventional DCOs such that the frequency update is shifted outside the band of interest wherein the sigma-delta processing gain is implemented within the frequency band associated with the antenna filter. The spurious response is then also shifted to the much higher frequency where they are suppressed by the sigma-delta processing; and any residual tones remaining are then eliminated by the antenna filter (not shown). The present delta-sigma processing architecture operates in the absence of a control voltage to increase the achievable resolution to about 1 kHz, whereas conventional DCOs function with a maximum resolution of about 20 kHz.

According to the most preferred embodiment, each capacitor within varactor banks 202, 204, 206 is driven by one bit of the control word communicated to the varactor bank, in which each bit of the control word can change between two voltage states ($V_{tunehigh}$ and $V_{tunelow}$). Most preferably, the two voltage states ($V_{tunehigh}$ and $V_{tunelow}$) are selected such that the associated LC circuit tuning characteristics (frequency versus voltage) have a zero local frequency dependency. It can be appreciated then, that no noise can "walk through" the LC circuit at the two voltage states ($V_{tunehigh}$ and $V_{tunelow}$), and the LC circuit will be robust to noise during the dithering process. The present inventors have found the foregoing dithering process to have a very strong power supply rejection ratio (PSRR), on the order of less than 1 kHz as compared with conventional DCOs using switched capacitor bank techniques that have PSRRs between 1 MHz and 10 MHz. Since the dithering process is insensitive to noise, the present DCO 200 can advantageously be driven without use of a voltage regulator, an important advantage over conventional DCOs.

FIG. 4 is a diagram illustrating high bank, low bank and thermometer bank control ranges and granularities (logarithmic scale) associated with the DCO high, low and thermometer varactor banks 202, 204 and 206, depicted in FIG. 2 and suitable to accommodate the Gaussian frequency shift keying (GFSK) modulation scheme of "BLUETOOTH" or GSM. Each capacitor bank 202, 204, 206 contain voltage-controlled capacitors (varactors), wherein each bank has its associated capacitor values set differently from one another to control different oscillation frequency ranges and granularity. Further, they differ in control word coding schemes.

The high bank (HB) 202 is most preferably implemented to coarsely center the operating frequency range of the DCO 200 due to process, supply voltage, and/or temperature variations. The HB 202 bits are also most preferably calibrated only on power-up or any other "as needed" basis. This bank 202 controls the largest frequency range and has a granularity that is quite coarse. The high bank 202 therefore comprises the largest value varactors among the capacitor banks 202, 204, 206. Since the high bank 202 varactors are binary-weighted, the control word is binary-coded to accommodate switching control wherein the value of the (n+1) order varactor is twice as large as that of the n-order varactor.

The low bank (LB) 204, according to one embodiment, is used for channel hopping (channel selection). The LB 204 sets the center frequency for a transmission channel and most preferably has enough range (plus some margin) to cover all allowed frequency channels (e.g., 78 for "BLUETOOTH"). The granularity of the low bank 204 is most preferably chosen in such a way as to allow the thermometer capacitor bank 206 to cover a contiguous frequency range during data modulation. The LB 204 varactors are most preferably also binary-coded, as discussed above in association with the HB 202 varactors.

The thermometer varactor bank (TB) 206, according to one preferred embodiment, is used for GFSK data modulation. The range that TB 206 must cover therefore is h*R frequency range, where h=modulation index and R=data rate. The present inventors found that due to process variations when the actual TB 206 granularity is smaller than expected, and extra "guard range" should most preferably be added. The minimum TB 206 granularity corresponds to the DCO 200 granularity (non-dithering case) and is related to the achievable minimum size of the unit varactor discussed herein before. As also stated above, the TB 206 is composed of a collection of unit varactors. The purpose is to match the controllable "update" timing on all TB 206 varactors so as to minimize the reference beat when this update is performed in the neighborhood of the zero-crossings of the LC tank voltage. If the TB 206 varactors were binary-weighted, the updates would then be done at different times for different control bits, thereby causing data-dependent spurious tones. The TB 206 bits are most preferably thermometer-coded such that for a control input value N, N varactors are "enabled." This allows a minimal number of varactors to be updated for small updates to the input control word, which applies to modulation.

The frequency granularity of a unit varactor according to one embodiment, was found by the present inventors to be 10 kHz. To accommodate a 2× margin, the TB range necessary for "BLUETOOTH" RF communications is then:

TB_range=2*h*R=2*0.32*1 MHz=[640 kHz], depicted as 402 in FIG. 4;

and the bits necessary to represent TB=log2(640 khz/10 kHz)=6-bits.

The LB 204 range is then:

LB_lsb=TB-range-h*R=320 kHz;

which implies the bits necessary for channel selection can be determined from log2((Nch*R)/(h*R))=78/0.32=243 which implies that 8-bits are necessary; and LB_range=255*LB_lsb=255*320 kHz=[81.6 MHz], depicted as 404 in FIG. 4.

The HB 202 range is:

HB_lsb<LB_range-Nch*R=81.6 MHz-78 MHz=3.6 MHz which implies that HB_lsb can be selected as 3 MHz. Using 8-bits to represent HB, HB_range=255*HB_lsb=[765 MHz], depicted as 406 in FIG. 4.

Figure 5A:
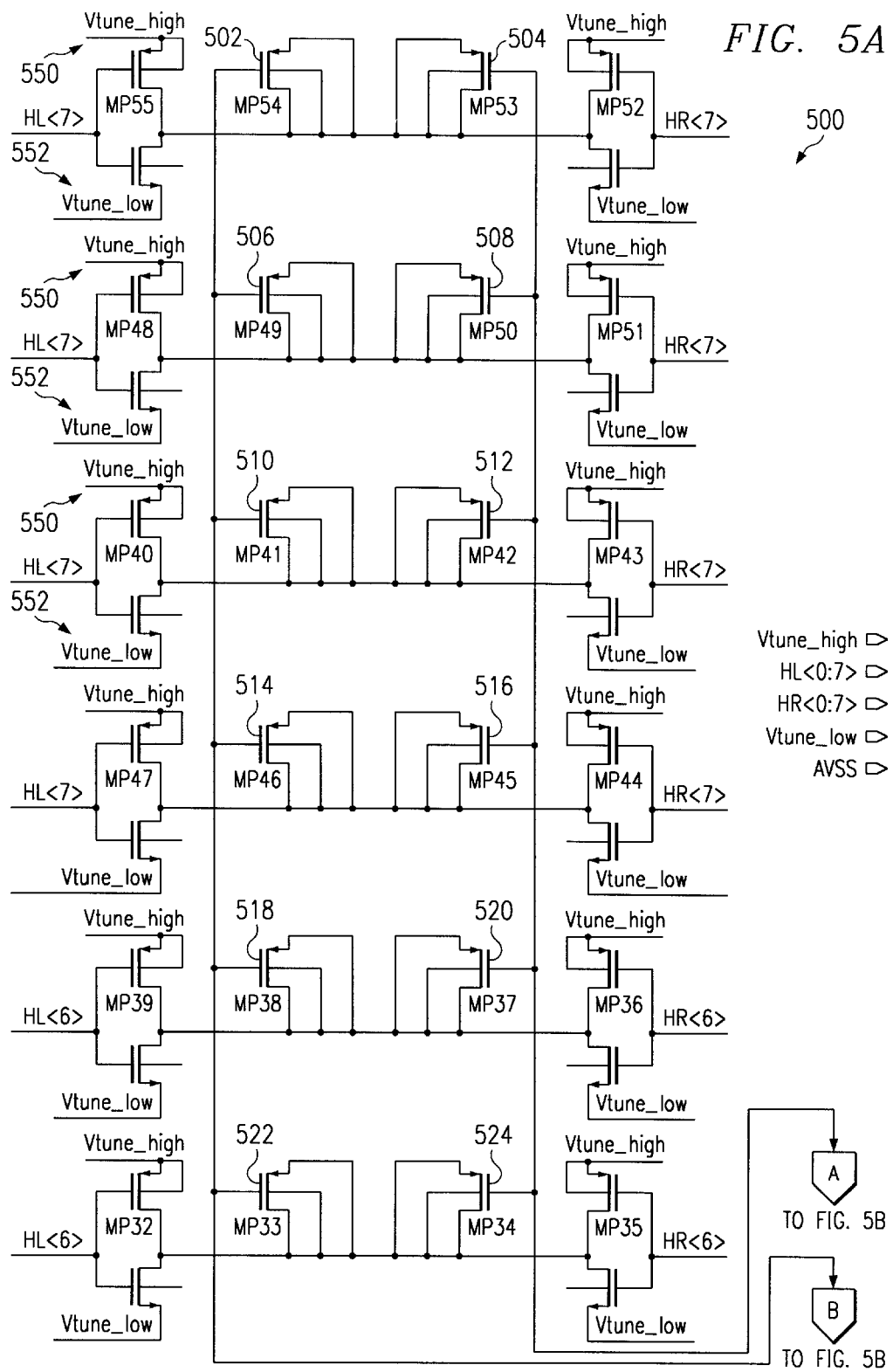
FIGS. 5(A,B) is a schematic diagram illustrating a high capacitor bank architecture suitable for use with the DCO depicted in FIG. 2 according to the most preferred embodiment of the present invention.
Figure 5B:
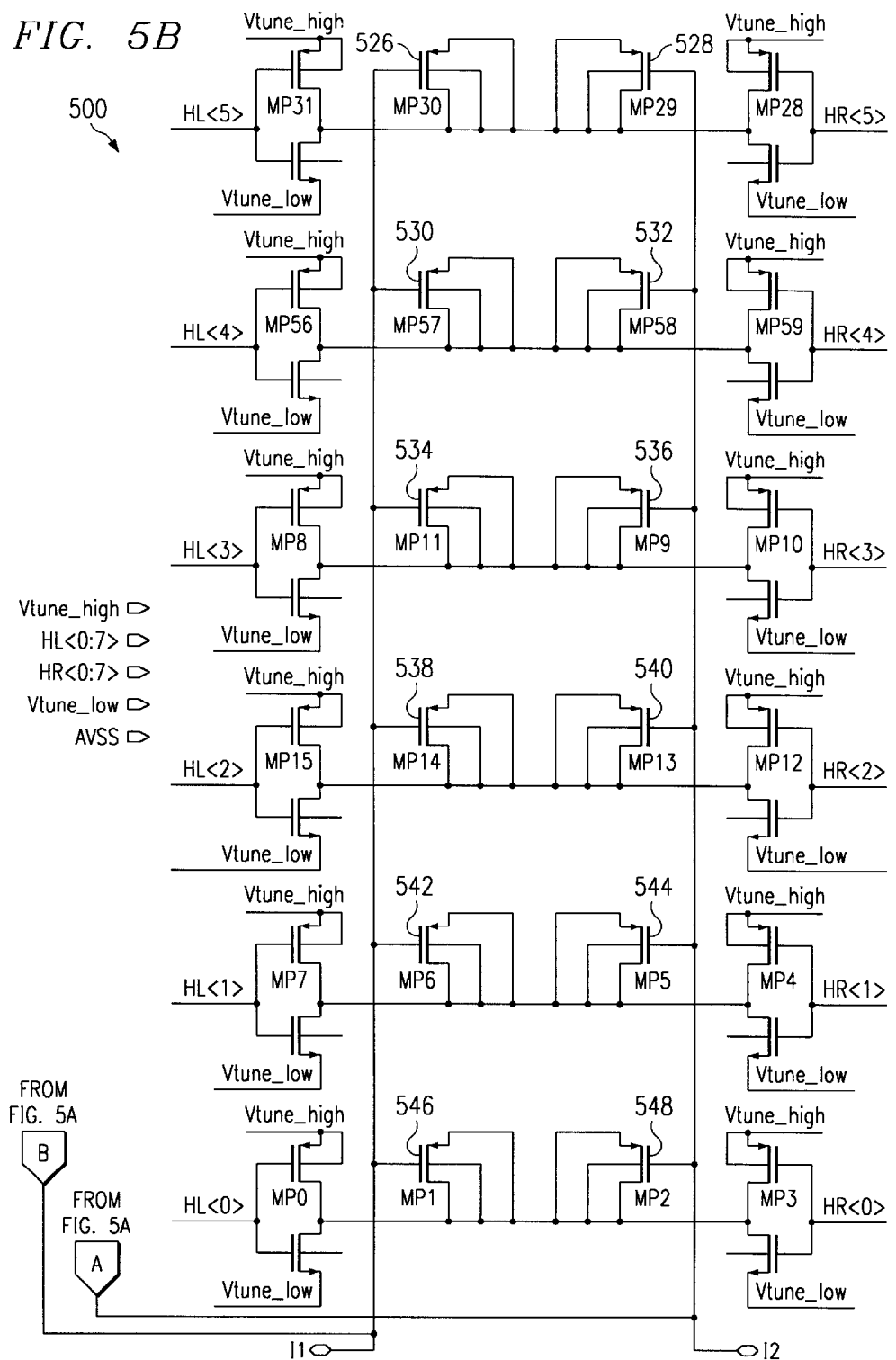

FIG. 5 is a schematic diagram illustrating a detailed high capacitor bank (HB) architecture 500 suitable for use with the DCO 200 depicted in FIG. 2 according to the most preferred embodiment of the present invention. The HB 500 includes a plurality of varactors 502–548 configured as a binary-weighted array of controllable capacitors. The number of varactors/capacitors depends upon the number of bits in the control word, wherein the width of the control word may vary, depending upon the frequency range and resolution desired, as stated herein before. In the instant embodiment, eight lines, HL7/HR7–HL0/HR0, are presented to the HB 500. In any event, the cumulative capacitance of the controllable varactors 502–548, in their respective states as set by the state of their corresponding control line HL/HR pair, determines the capacitance presented to the tunable LC oscillator by the high capacitor bank (HB) 500. In the instant embodiment, the states of each control line HL/HR pair are determined by $V_{tunehigh}$ 550 and $V_{tunelow}$ 552, where $V_{tunehigh}$ 550 and $V_{tunelow}$ 552 are operable to switch the capacitance associated with each control line pair HL/HR between a minimum value and a maximum value. $V_{tunehigh}$ 550 and $V_{tunelow}$ 552 are most preferably selected in a way such that voltage perturbations will be minimized with changes in frequency for a desired range of frequencies in order to minimize noise contributions associated with the control lines HL/HR. The HB 500 architecture can be seen to have a plurality of varactors associated with each control line. This is necessary to achieve a desired capacitance value when implementing specific CMOS manufacturing processes such that the desired frequency range and resolution can be accommodated for the tunable LC tank circuit using the HB 500 to form at least a portion of the tank circuit capacitance. A tunable LC tank circuit using the HB 500 is discussed more fully herein below with reference to FIG. 8. The physical sizes of the varactors (and therefore capacitance) associated with the HB 500 are selected to implement tuning over a frequency range of 765 MHz with a granularity of 3 MHz, as discussed above.

Figure 6A:
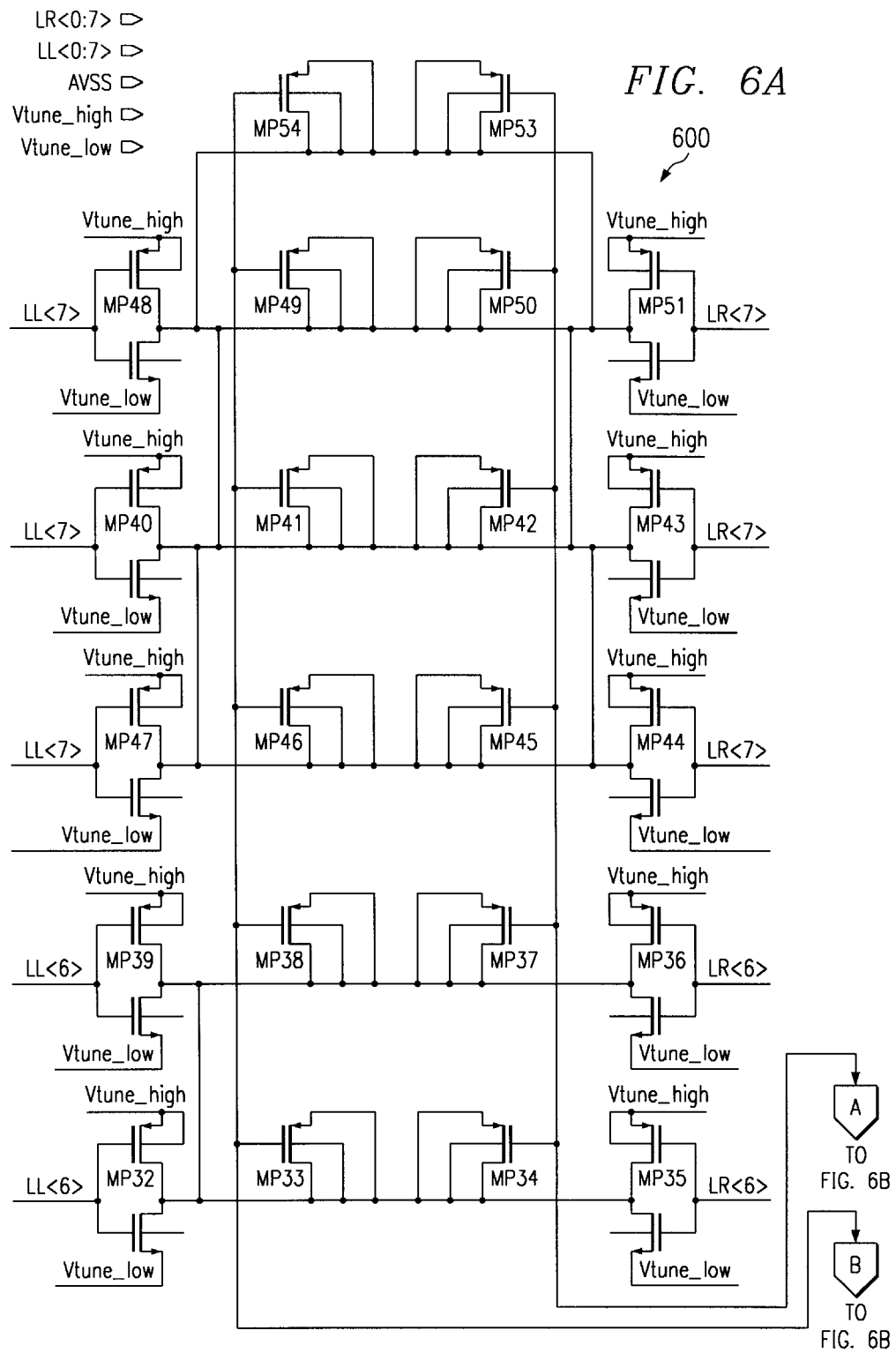
FIGS. 6(A,B) is a schematic diagram illustrating a low capacitor bank architecture suitable for use with the DCO depicted in FIG. 2 according to the most preferred embodiment of the present invention.
Figure 6B:
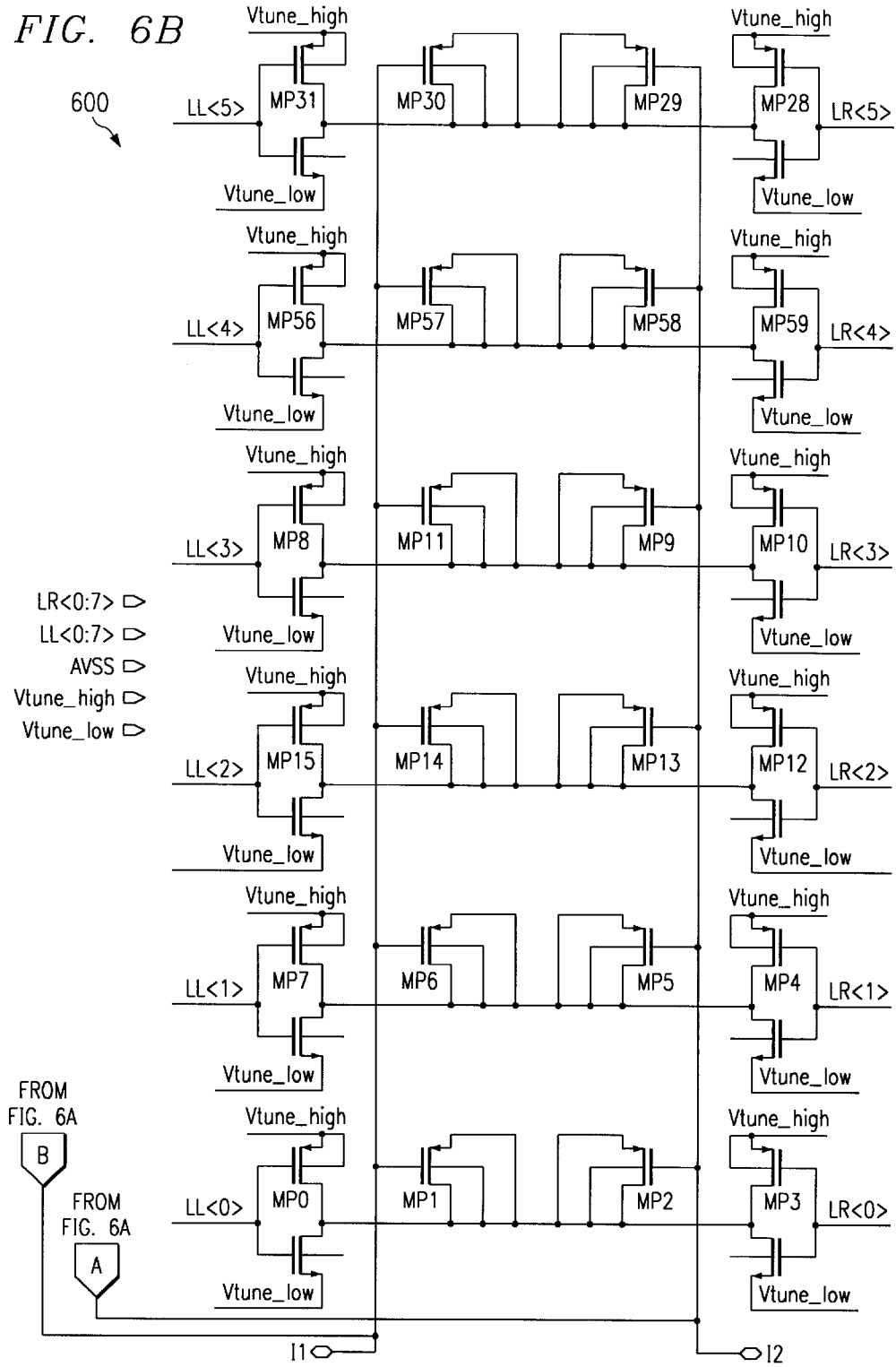

FIG. 6 is a schematic diagram illustrating a low capacitor bank architecture 600 suitable for use with the DCO 200 depicted in FIG. 2 according to the most preferred embodiment of the present invention. The architecture and operation of the low capacitor bank (LB) 600 is identical with that described above in association with the high capacitor bank 500, except the physical sizes (and therefore capacitance) of the varactors associated with the LB 600 are smaller to allow finer tuning of the tunable LC tank circuit in order to implement tuning over a frequency range of 81.6 MHz with a granularity of 320 kHz, as discussed herein before.

Figure 7B:
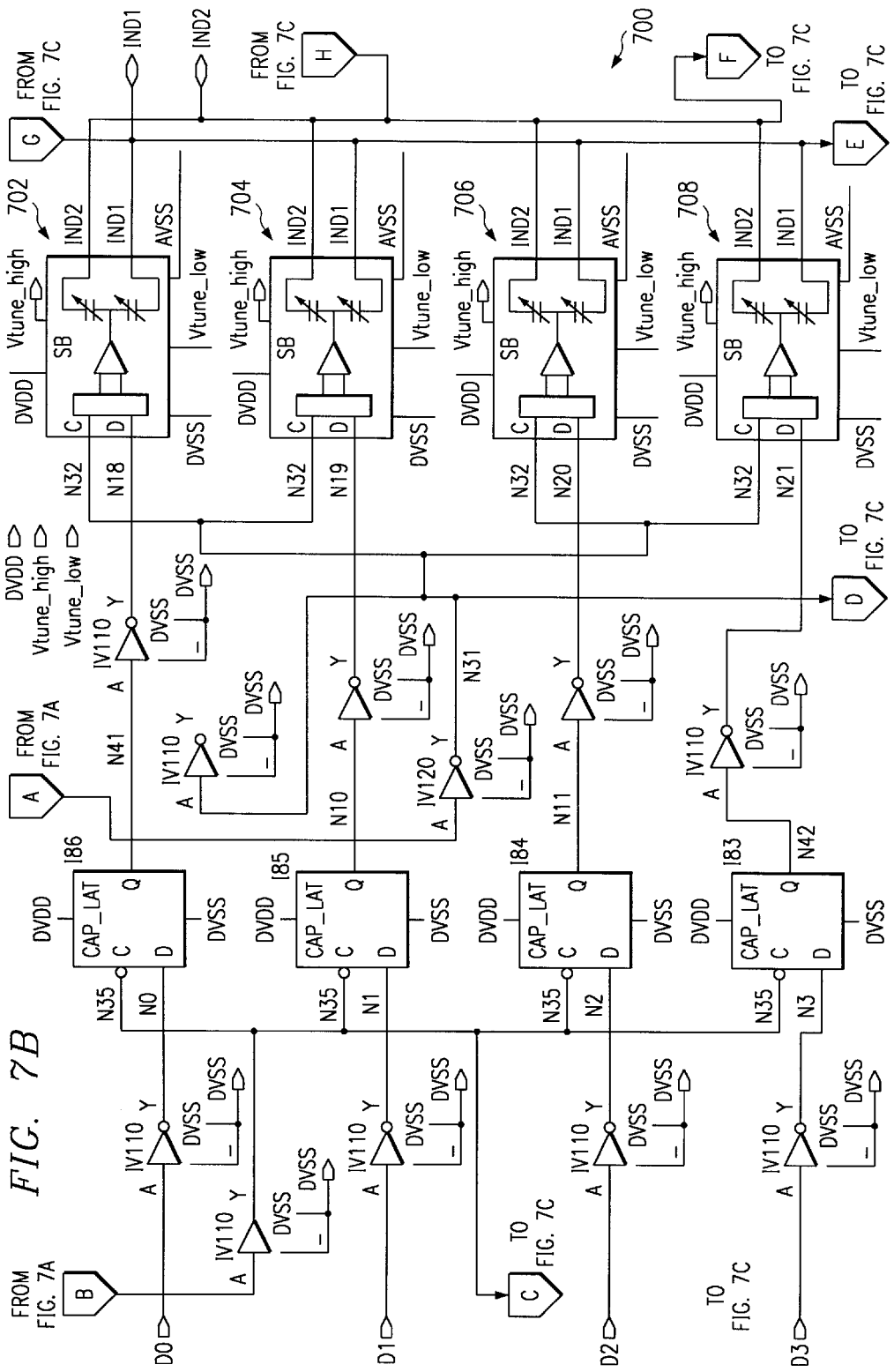
FIGS. 7(A,B,C) is a schematic diagram illustrating a thermometer capacitor bank architecture suitable for use with the DCO depicted in FIG. 2 according to the most preferred embodiment of the present invention.
Figure 7C:
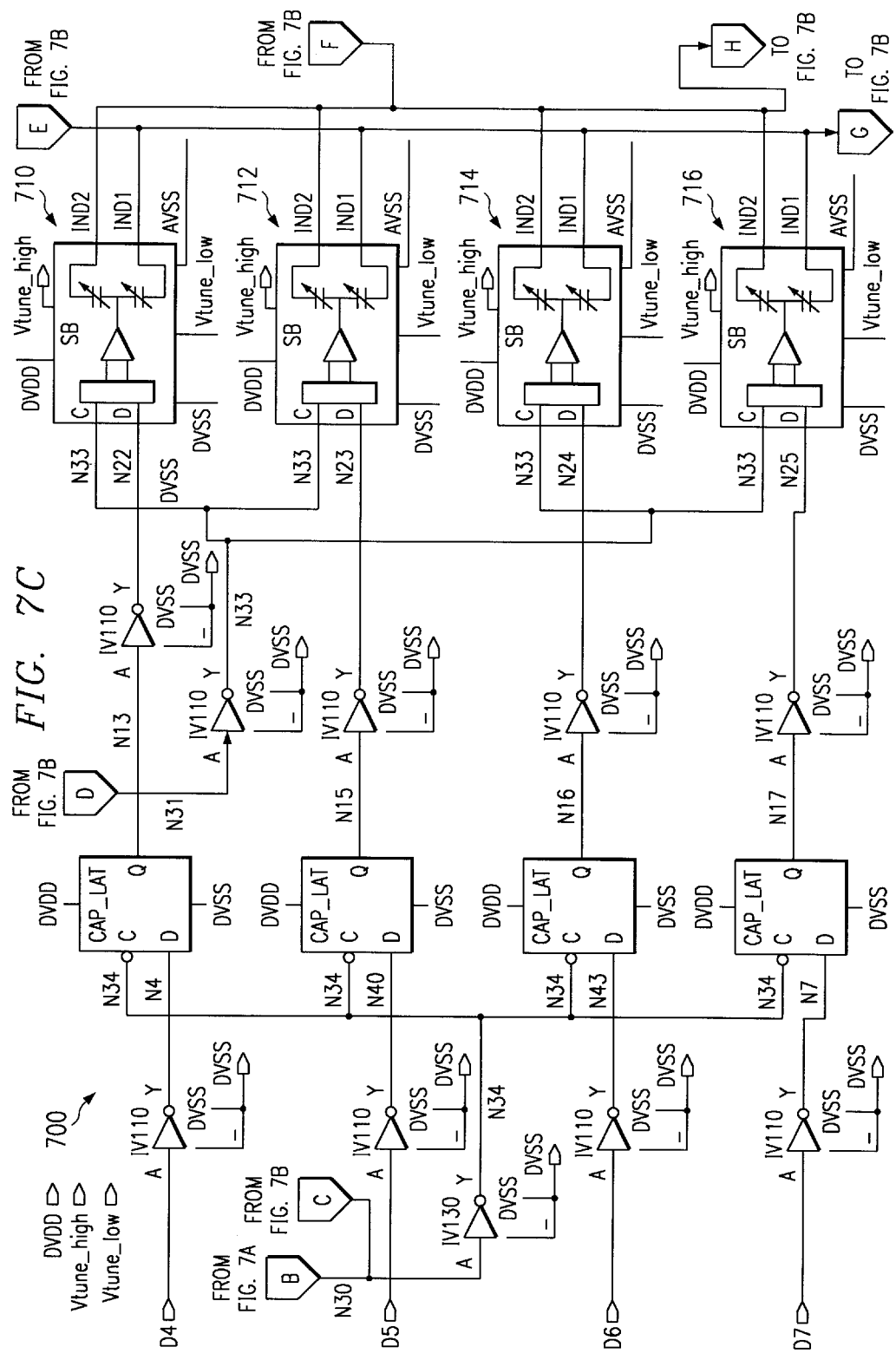

FIG. 7 is a schematic diagram illustrating a thermometer capacitor bank (TB) architecture 700 suitable for use with the DCO 200 depicted in FIG. 2 according to the most preferred embodiment of the present invention. TB 700 has eight pairs of unit-sized varactors 702–716 that can be combined with the HB 500 and LB 600 capacitor banks to allow even finer tuning of the tunable LC tank circuit in order to implement tuning over a frequency range of 640 kHz with a granularity of 10 kHz and therefore allow the DCO 200 to accommodate "BLUETOOTH" radio frequency communications. Each pair of unit-sized varactors 702–716 is switchably controlled by a control word bit (e.g. D0–D7) such as described herein before with reference to the HB 500 and LB 600 capacitor-arrays. arrays.

A more highly detailed drawing of a pair of unit-sized varactors 800 forming a two capacitor cell for the thermometer capacitor bank (TB) 700 is shown in FIG. 8. The varactors 800 can be seen to be driven via a capacitive buffer driver 802. The buffer driver 802 operates in the optimal regions of the C-V (capacitance vs. voltage) characteristic in which voltage perturbations do not result in changes to the capacitance. One portion is called $V_{tunelow}$ and the other portion $V_{tunehigh}$. These voltage levels are then selected as the voltage levels to switch the respective varactors between their minimum and maximum capacitance levels as described herein before. One varactor 804 is then connected to one side 902 of the inductor 906 while the other varactor 806 is connected to the opposite side 904 of the inductor to implement the tunable LC tank circuit 900 discussed herein below with reference to FIG. 9.

FIG. 9 is a schematic diagram illustrating a tunable LC tank circuit 900 incorporating the high capacitor bank 500, low capacitor bank 600 and thermometer capacitor bank 700 circuits shown in FIGS. 5–7 respectively. The requisite frequency control word is transmitted to the capacitor banks 500, 600, 700 via control (data input) lines 908–918 respectively. As stated above, the inductor 906 is a center-tapped transformer-like inductor wherein one side of the inductor 906 is tied to a left bank array of varactors and the right side of the inductor 906 is tied to a right bank array of varactors to implement the tunable LC tank circuit 900. Other LC configurations can also be used to implement the present invention in which separate (left, right) banks will not be necessary to control the frequency range and resolution.

Figure 10:
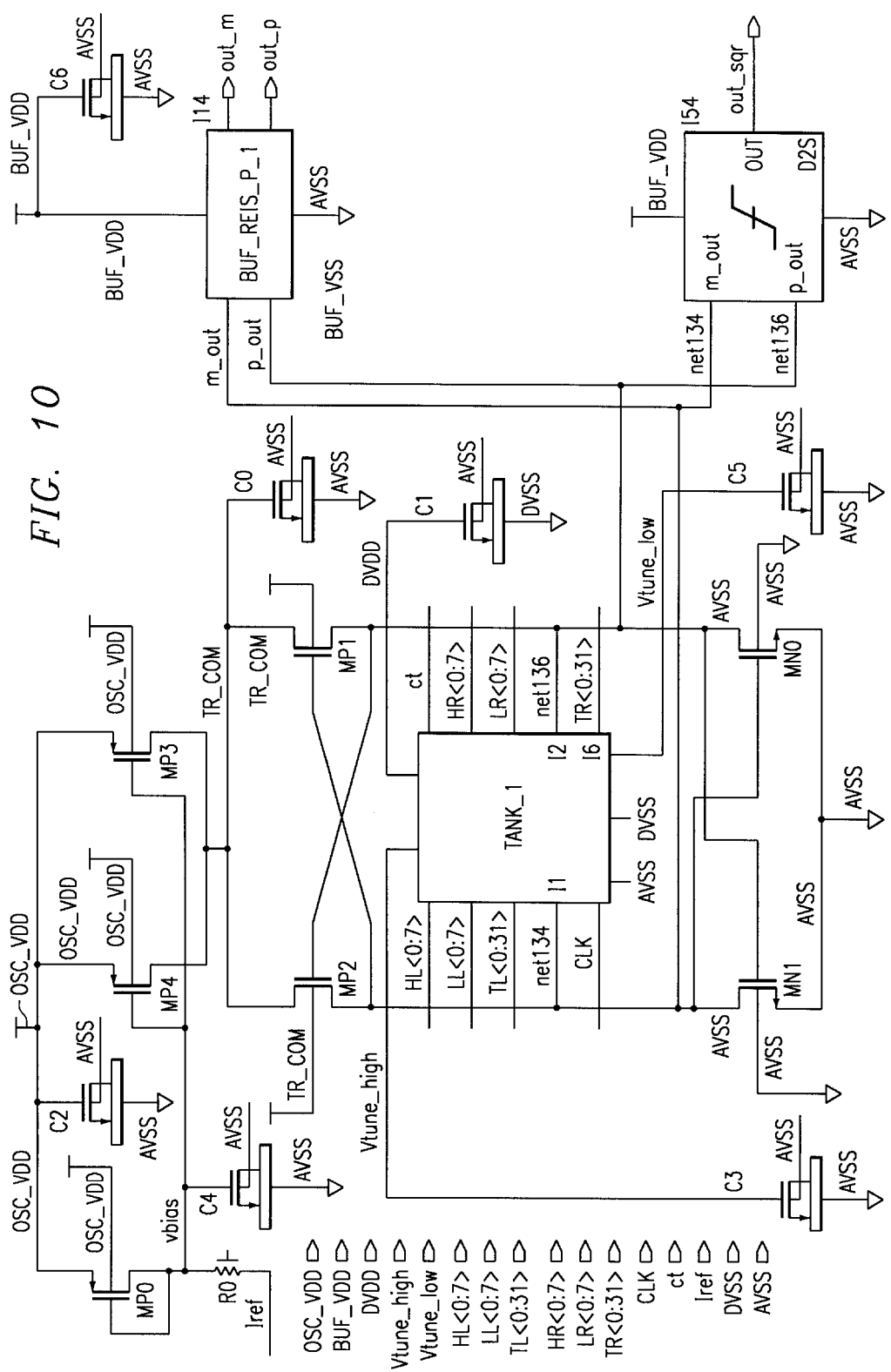
FIG. 10 is a schematic diagram illustrating the present DCO configured as part of a system capable of generating an RF output signal and a digital output signal.

FIG. 10 is simply a more detailed schematic diagram illustrating the present DCO 200 depicted in FIG. 2 and that is capable of generating both an RF output signal and a digital output signal.

Figure 11:
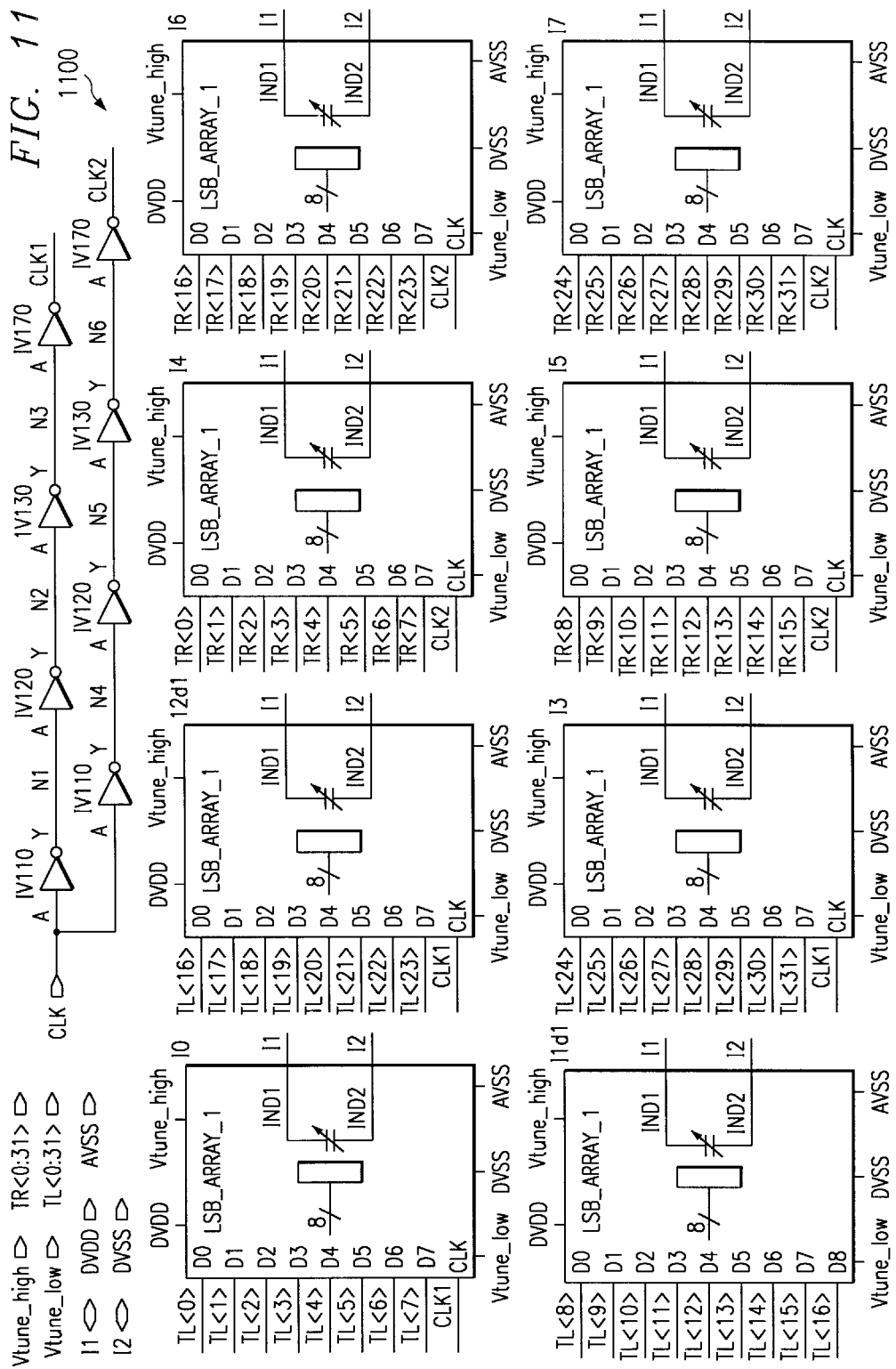
FIG. 11 illustrates a plurality of thermometer capacitor array banks such as shown in FIG. 7 and configured to minimize switching errors due to physical differences between individual varactor capacitors.

FIG. 11 simply illustrates a plurality of varactor capacitor array banks 1100 configured to switch in a random pattern such that physical differences between the individual TB 700 varactors can be averaged during RF communications.

Figure 12:
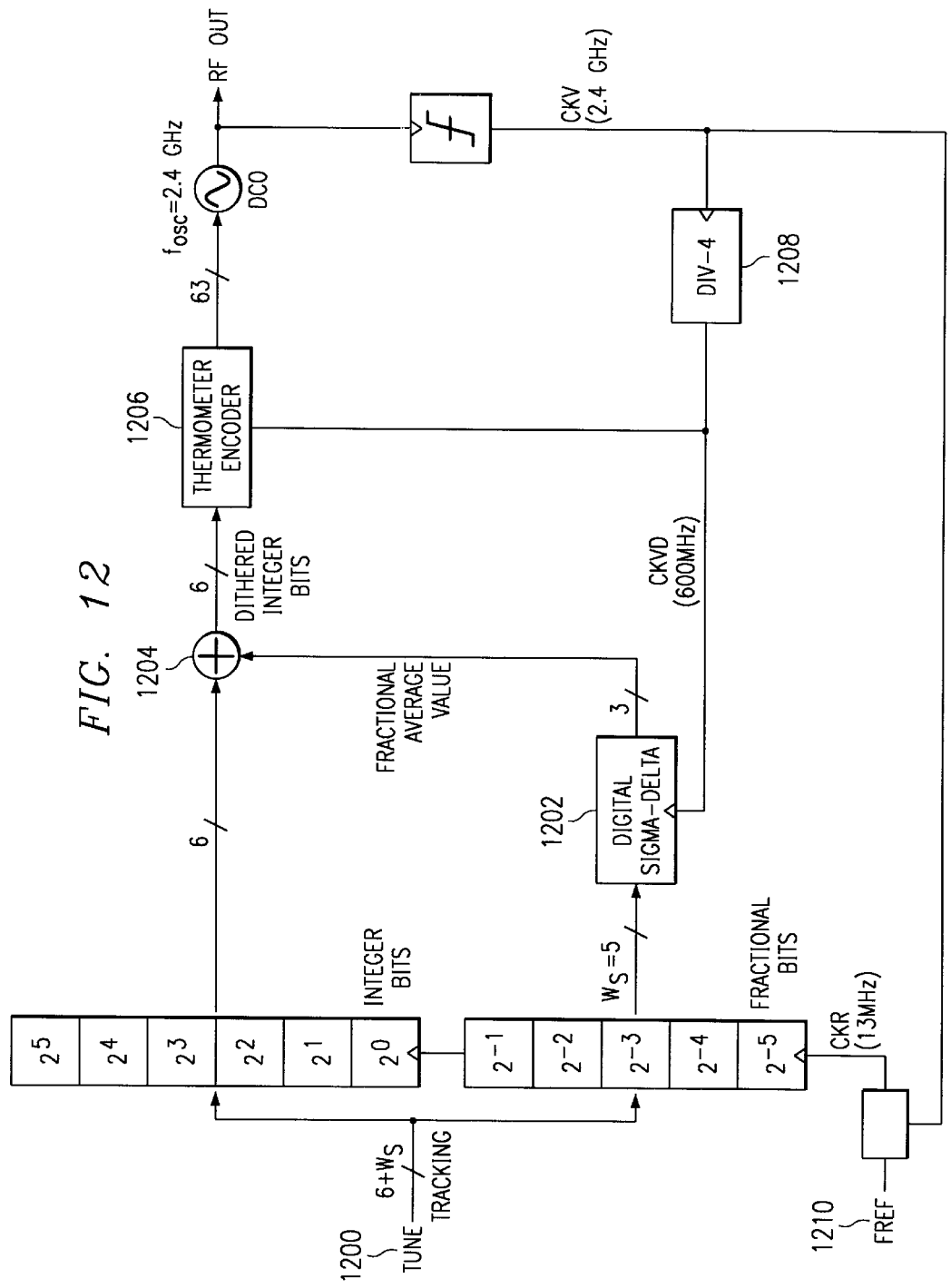
FIG. 12 is a simplified block diagram illustrating how dithering is implemented for the DCO depicted in FIG. 2.

FIG. 12 is a simplified block diagram illustrating how the above discussed dithering process is implemented for the DCO 200 depicted in FIG. 2 according to the most preferred embodiment of the present invention. A tuning control word 1200 is received that can be any number of desired bits required to implement a desired function. The tuning control word 1200 for the instant embodiment is depicted as having 6 integer bits and 5 fractional bits. The 5 fractional bits are dithered via digital sigma-delta modulator 1202 in a manner well known to those skilled in the art to generate a fractional average value. This fractional average value is then summed via sum element 1204 with the 6 integer bits to generate 6 dithered integer bits that are then communicated to a thermometer encoder 1206. The thermometer encoder 1206 operates to enable N varactors in response to a thermometer encoder control input value "N". The actual dithering frequency is set by a clock divider 1208 the receives the DCO 200 digital output signal and divides it down to a frequency value that is significantly greater than the reference frequency 1210 to provide the desired resolution, but that is also low enough to provide a desired power dissipation. It can be seen that the dithering frequency is 600 MHz for the embodiment depicted in FIG. 12, although many other dithering frequencies can be used so long as the dithering frequency employed is sufficient to provide both the desired frequency resolution and the desired power dissipation.

In view of the above, it can be seen the present invention presents a significant advancement in the art of digitally controlled oscillators and associated methods. A fully digitally-controlled LC tank oscillator (DCO) has been described that uses a bank of binary and/or equal weighted capacitors that are switched between only two frequency independent potentials. The resolution of the LSB capacitor is modulated using fast switching (dithering) between the two states, where the averaging is achieved by the Q factor of the LC oscillator tank in association with the modulation index of the resulting frequency modulation that is very small compared with the modulation speed. Spurious emissions can be reduced using sigma delta modulation techniques and residual tones can be suppressed by an antenna filter.

This invention has been described in considerable detail in order to provide those skilled in the digitally-controlled VCO (DCO) art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, while certain embodiments set forth herein illustrate various hardware implementations, the present invention shall be understood to also parallel structures and methods using software implementations as set forth in the claims.

What is claimed is:

1. A digitally-controlled oscillator comprising:

an inductor element; and a plurality of controllable capacitors coupled to the inductor element to formulate a tunable LC circuit having an output, each capacitor having an input node, wherein a first portion of the controllable capacitor input nodes is configured to receive more significant bits of a digital control word such that a first capacitance can be presented to the tunable LC circuit in response thereto, and further wherein a second portion of the controllable capacitor input nodes is operational to receive at least one dithered and noise shaped less significant bit of a digital control word such that a modulated second capacitance can be presented to the tunable LC circuit, wherein the resonant frequency associated with the tunable LC circuit is adjusted in response to the first capacitance and the modulated second capacitance.

2. The digitally-controlled oscillator according to claim 1 wherein the inductor element comprises a center-tapped inductor.

3. A digitally-controlled oscillator comprising:

a center-tapped inductor;

a plurality of controllable capacitors coupled to the inductor to formulate a tunable LC circuit having an output, each capacitor having an input node, wherein a first portion of the controllable capacitor input nodes is configured to receive more significant bits of a digital control word such that a first capacitance can be presented to the tunable LC circuit in response thereto, and further wherein a second portion of the controllable capacitor input nodes is operational to receive at least one dithered and noise shaped less significant bit of a digital control word such that a modulated second capacitance can be presented to the tunable LC circuit, wherein the resonant frequency associated with the tunable LC circuit is adjusted in response to the first capacitance and the modulated second capacitance, wherein the plurality of controllable capacitors comprise a plurality of more significant capacitors and at least one less significant capacitor.

4. The digitally-controlled oscillator according to claim 1 wherein the tunable LC circuit is self-oscillating to generate a signal at the output.

5. The digitally-controlled oscillator according to claim 4 further comprising output circuitry having an input node coupled to the oscillator output and further having an output node configured for generating a digital signal at an RF frequency in response to the signal generated at the oscillator output.

6. A digitally-controlled oscillator comprising:

an inductor element;

a plurality of controllable capacitors coupled to the inductor to formulate a tunable LC circuit having an output, each capacitor having an input node, wherein a first portion of the controllable capacitor input nodes is configured to receive more significant bits of a digital control word such that a first capacitance can be presented to the tunable LC circuit in response thereto, and further wherein a second portion of the controllable capacitor input nodes is operational to receive at least one dithered less significant bit of a digital control word such that a modulated second capacitance can be presented to the tunable LC circuit, wherein the resonant frequency associated with the tunable LC circuit is adjusted in response to the first capacitance and the modulated second capacitance, wherein the plurality of controllable capacitors comprise a plurality of more significant capacitors and at least one less significant capacitor; and a gain circuit having an input configured to receive a new digital control word and generate a DCO tuning control word therefrom.

7. The digitally-controlled oscillator according to claim 6 wherein the gain circuit comprises a dithering circuit having an input configured to receive and dither at least one digital control word less significant bit.

8. The digitally-controlled oscillator according to claim 7 wherein the dithering circuit is operative to generate a dithering clock that is derived from and synchronous with LC oscillator output signal.

9. A digitally-controlled oscillator comprising:
a tunable self-oscillating LC oscillator having an output and including a plurality of controllable more significant capacitors and at least one controllable less significant capacitor, the more significant capacitors and the at least one controllable less significant capacitor coupled to at least one inductor, the more significant capacitors configured to receive more significant bits of a digital control word such that a first capacitance can be presented to the tunable LC oscillator in response thereto, the at least one less significant capacitor configured to receive at least one dithered and noise shaped less significant bit of a digital control word such that a modulated second capacitance can be presented to the tunable LC oscillator in response thereto, wherein the resonant frequency associated with the tunable LC oscillator is averaged in response to the modulated capacitance.

10. The digitally-controlled oscillator according to claim 9 wherein the at least one inductor comprises a center-tapped inductor.

11. The digitally-controlled oscillator according to claim 9 further comprising output circuitry having an input coupled to the tunable LC oscillator output, the output circuitry operative to generate a digital signal at an RF frequency in response to a signal generated at the tunable LC oscillator output.

12. A digitally-controlled oscillator comprising:
a tunable self-oscillating LC oscillator having an output and including a plurality of controllable more significant capacitors and at least one controllable less significant capacitor, the more significant capacitors and the at least one controllable less significant capacitor coupled to at least one inductor, the more significant capacitors configured to receive more significant bits of a digital control word such that a first capacitance can be presented to the tunable LC oscillator in response thereto, wherein the resonant frequency associated with the tunable LC oscillator is averaged in response to a modulated capacitance; and a gain circuit having an input configured to receive and partition a digital control word to generate the more significant bits and the at least one less significant bit therefrom.

13. The digitally-controlled oscillator according to claim 12 wherein the gain circuit comprises a dithering circuit having an input configured to receive and dither the at least one less significant bit.

14. A digitally-controlled oscillator comprising:
means for generating an output signal at a desired RF frequency in response to a plurality of more significant control bits and further in response to at least one dithered less significant bit;

means for receiving a digital control word and generating the plurality of more significant control bits and at least one less significant control bit therefrom; and means for dithering and noise shaping the at least one less significant control bit, wherein the plurality of more significant control bits and the at least one dithered and noise shaped less significant control bit are communicated to the means for generating an output signal and therein control the desired RF frequency.

15. The digitally-controlled oscillator according to claim 14 wherein the means for generating a signal at a desired RF frequency comprises a self-oscillating LC oscillator.

16. The digitally-controlled oscillator according to claim 15 wherein the self-oscillating LC oscillator comprises a plurality of controllable capacitors coupled to at least one inductor to formulate a tunable LC circuit having an output, each capacitor having an input node, wherein a first portion of the controllable capacitor input nodes is configured to receive the plurality of more significant bits such that a first capacitance can be presented to the tunable LC circuit in response thereto, and further wherein a second portion of the controllable capacitor input nodes is configured to receive the at least one dithered less significant bit such that a modulated second capacitance can be presented to the tunable LC circuit, wherein the resonant frequency associated with the tunable LC circuit is adjusted in response to the first capacitance and the modulated second capacitance.

17. The digitally-controlled oscillator according to claim 14 wherein the means for receiving a digital control word and generating a plurality of more significant control bits and at least one less significant control bit therefrom comprises a gain element.

18. A digitally-controlled oscillator comprising:
means for generating an output signal at a desired RF frequency in response to a plurality of more significant control bits and further in response to at least one dithered less significant bit;

a dithering clock, derived from and synchronous with the output signal, for receiving a digital control word and generating the plurality of more significant control bits and at least one less significant control bit therefrom;

means for dithering the at least one less significant control bit, wherein the plurality of more significant control bits and the at least one dithered less significant control bit are communicated to the means for generating an output signal and therein control the desired RF frequency.

19. A method of generating a signal at a desired RF frequency comprising the steps of:
a) providing a self-oscillating LC oscillator having a plurality of controllable capacitors;
b) generating a digital control word;
c) dithering and noise shaping at least one less significant bit of the control word;
d) communicating more significant bits of the digital control word to a first portion of the controllable capacitors thereby causing the first portion of controllable capacitors to present a first capacitance to the LC oscillator; and
e) communicating the at least one dithered less significant bit to a second portion of the controllable capacitors thereby causing the second portion of the controllable capacitors to present an averaged second capacitance to the LC oscillator, wherein the first capacitance and the averaged second capacitance operate to tune the resonant frequency of the LC oscillator to control the desired RF frequency.

20. A digitally-controlled oscillator comprising:

at least one inductor;

at least one bank of binary-weighted capacitors configured to provide a first capacitance in response to predetermined more significant bits of a tuning control word;

a bank of unit-weighted capacitors configured to provide an average capacitance in response to at least one predetermined dithered and noise shaped less significant bit of the tuning control word, wherein the first capacitance and the average capacitance are connected to the at least one inductor to implement a self-oscillating tunable LC oscillator that is responsive to the tuning control word to modulate the LC oscillator resonant frequency such that a signal is generated at a desired RF frequency.

21. The digitally-controlled oscillator according to claim 20 further comprising means for generating the at least one predetermined dithered less significant bit.

22. A digitally-controlled oscillator comprising:

at least one inductor;

at least one bank of binary-weighted capacitors configured to provide a first capacitance in response to predetermined more significant bits of a tuning control word;

a bank of unit-weighted capacitors configured to provide an average capacitance in response to at least one predetermined dithered less significant bit of the tuning control word, wherein the first capacitance and the average capacitance are connected to the at least one inductor to implement a self-oscillating tunable LC oscillator that is responsive to the tuning control word to modulate the LC oscillator resonant frequency such that a signal is generated at a desired RF frequency; and means for generating the at least one predetermined dithered less significant bit being operative to selectively dither each capacitor within the bank of unit-weighted capacitors between only two voltage levels that are substantially insensitive to local voltage perturbations.

23. A method of generating a radio frequency signal comprising the steps of:

(a) providing a tunable self-oscillating LC oscillator having at least one bank of binary-weighted capacitors and at least one bank of unit-weighted capacitors, wherein the at least one bank of binary-weighted capacitors and the at least one bank of unit-weighted capacitors are operative to control the oscillator capacitance C in response to a digital tuning control word;

(b) generating a digital tuning control word having a predetermined number of bits;

(c) dithering and noise shaping at least one less significant bit of the digital tuning control word; and (d) communicating more significant bits to the at least one bank of binary-weighted capacitors to implement a first capacitor; and (e) communicating the dithered at least one less significant bit of the digital tuning control word to the at least one bank of unit-weighted capacitors to implement a second capacitor, such that the self-oscillating LC oscillator can generate a signal at an RF frequency determined by the oscillator inductance L and the oscillator capacitance C formed by the first and second capacitors in response to the digital tuning control word.

24. A digitally-controlled oscillator (DCO) comprising:

a tunable self-oscillating L-C oscillator having an output and a controllable capacitor coupled to at least one inductor, wherein the controllable capacitor is at least responsive to a dithered and noise shaped bit such that a time-averaged value of capacitance can be presented to the tunable L-C oscillator to refine the resolution of a resonating frequency associated with the tunable L-C oscillator.

25. The digitally-controlled oscillator according to claim 24 wherein the at least one inductor comprises a center-tapped inductor.

26. The digitally-controlled oscillator according to claim 24 further comprising a gain element operative to generate a DCO tuning control word in response to a digital control word.

27. A digitally-controlled oscillator (DCO) comprising:

a tunable self-oscillating L-C oscillator having an output and a controllable capacitor coupled to at least one inductor, wherein the controllable capacitor is at least responsive to a dithered bit such that a time-averaged value of capacitance can be presented to the tunable L-C oscillator to refine the resolution of a resonating frequency associated with the tunable L-C oscillator; and a gain element operative to generate the dithered bit in response to a digital control word.

* * * * *